United States Patent
Chittipeddi et al.

[11] Patent Number: 6,078,035
[45] Date of Patent: *Jun. 20, 2000

[54] INTEGRATED CIRCUIT PROCESSING UTILIZING MICROWAVE RADIATION

[75] Inventors: Sailesh Chittipeddi, Austin, Tex.; Stephen Knight, Bethlehem, Pa.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/577,077

[22] Filed: Dec. 22, 1995

[51] Int. Cl.$^7$ .................................................. H05B 6/80
[52] U.S. Cl. .................... 219/759; 219/678; 219/686; 146/DIG. 71; 438/676; 438/729
[58] Field of Search .................... 219/759, 678, 219/686; 437/174, 173, 247, 248; 148/DIG. 71; 438/57, 669, 676, 726, 729, 746

[56] References Cited

U.S. PATENT DOCUMENTS

| | | | |
|---|---|---|---|
| 4,490,183 | 12/1984 | Scovell | 148/DIG. 71 |
| 4,517,026 | 5/1985 | Inoue | 219/686 |
| 4,593,168 | 6/1986 | Amada | 219/686 |
| 4,749,615 | 6/1988 | Bonny et al. | 428/310.6 |
| 5,189,273 | 2/1993 | Inukai et al. | 219/759 |
| 5,417,494 | 5/1995 | Kempa et al. | 219/711 |
| 5,432,325 | 7/1995 | Katz et al. | 219/759 |
| 5,519,193 | 5/1996 | Freiermuth et al. | 219/678 |
| 5,707,466 | 1/1998 | Atwater et al. | 437/247 |

FOREIGN PATENT DOCUMENTS

| | | | |
|---|---|---|---|
| 63-25966 | 2/1988 | Japan | 219/678 |
| 63-76336 | 4/1988 | Japan | 219/759 |
| 4-265870 | 9/1992 | Japan | 219/678 |

*Primary Examiner*—Philip H. Leung
*Attorney, Agent, or Firm*—John T. Rehberg; Anthony Grillo

[57] ABSTRACT

Microwave radiation, perhaps with microwave absorbing materials, is utilized to provide heating of partially formed integrated circuits in a variety of circumstances.

19 Claims, 1 Drawing Sheet

INTEGRATED CIRCUIT PROCESSING UTILIZING MICROWAVE RADIATION

TECHNICAL FIELD

This invention relates to methods for fabricating integrated circuits.

BACKGROUND OF THE INVENTION

Typical integrated circuit manufacturing processes utilize many steps in which a wafer is heated. Wafer heating may be performed to: activate dopants, initiate silicidation reactions, flow dielectrics, etc.

In the past, wafer heating was accomplished by placing the wafer in a furnace for a predetermined period of time or else by subjecting the wafer to a rapid thermal anneal (RTA) process. Conventional processes presents a variety of disadvantages. Furnace heating must be carefully controlled because of thermal budget considerations. RTA processing requires careful control of gas flows and cleaning of the backside of the wafer for pyrometry purposes. Those concerned with the development of integrated circuit manufacturing processes, have consistently sought improved methods of thermal processing.

SUMMARY OF THE INVENTION

These concerns are addressed by the present invention which includes subjecting a substrate having partially fabricated integrated circuits thereon to microwave radiation without generation of a plasma.

DETAILED DESCRIPTION

Figure 1:
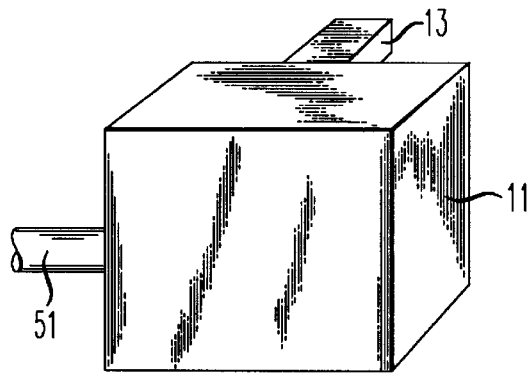
FIG. 1 is a perspective view.

Microwave radiation may be desirably utilized to perform a variety of thermal processes upon partially fabricated wafers. In FIG. 1, reference numeral 11 denotes a microwave oven. Reference numeral 13 denotes a source of microwave power, which may be typically a klystron, magnetron, etc.

Figure 2:
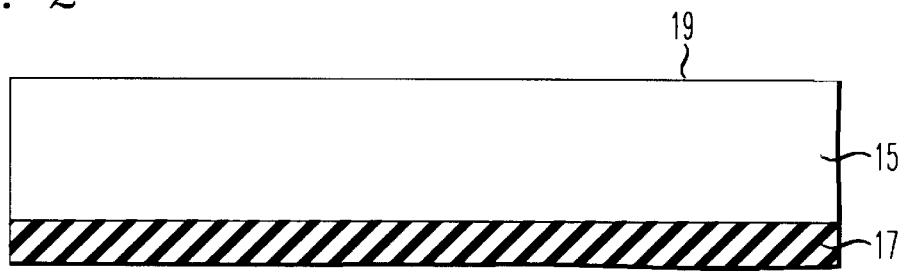
FIGS. 2–4 are cross-sectional views useful in understanding various embodiments of the present invention.

In FIG. 2, reference numeral 15 denotes a silicon wafer which may have partially fabricated integrated circuits upon its upper surface 19 (the integrated circuits are not shown for reasons of clarity). A microwave- absorbing substance 17 is coated on the underside of wafer 15. By way of example, some suitable microwave absorbers are carbon and silicon nitride. (A carbon coating can be made, illustratively by coating the surface with photoresist and then charring the photoresist.) Wafer 15 together with underside coating 17 is placed within microwave chamber 11 and subjected to microwave radiation. Microwave heating of substance 17 causes a uniform heating of wafer 15 suitable for dopant activation, flowing of dielectrics etc. In general, microwave radiation is radiation with frequencies between 3 and 300 GHz. No plasma is generated.

Figure 3:
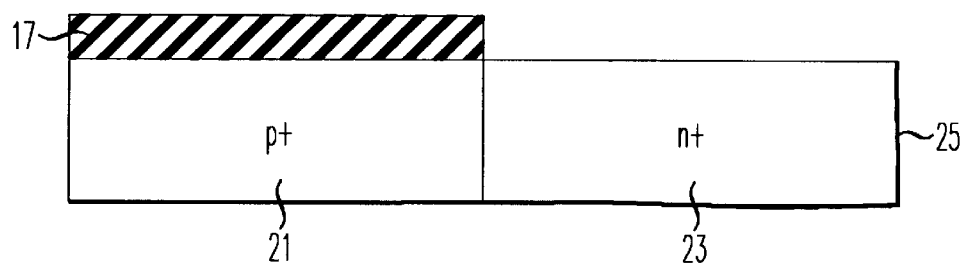

In FIG. 3, reference numeral 25 represents a portion of a silicon semiconductor wafer. Region 23 of wafer 25 is n+ doped. Region 21 of wafer 25 is p+ doped. Typically, the n+ and p+ dopants have been introduced into silicon wafer 25 by ion implantation. If it is desired to active the p+ dopants, a patterned layer of microwave absorbing material 17 may be positioned adjacent the p+ material. Then the structure of FIG. 3 is placed within cavity 11 and subjected to microwave radiation. The radiation is preferentially absorbed by patterned absorber 17, thereby causing activation of the p+ dopants without a similar effect upon the n+ dopants.

Figure 4:
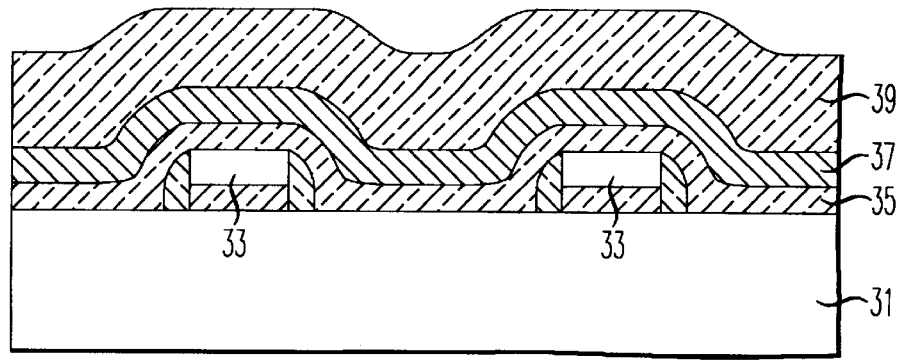

In FIG. 4, reference numeral 31 denotes a silicon substrate 31 with a gate structures 33 formed thereon. Dielectric 35 covers gate structures 33 and silicon substrate 31. (Source and drain regions are not shown.) Reference numeral 37 denotes a metal layer, such as aluminum or tungsten. Layer 37 is covered by flowable dielectric 39 which may be typically a doped glass or silicon dioxide, such as glass formed from TEOS, commonly denoted BPTEOS. The structure of FIG. 4 may be subjected to microwave radiation, thereby causing flow of dielectric 39. (If necessary, dielectric 39 may be coated with a microwave absorbing substance such as that denoted by reference numeral 17 in FIGS. 2 and 3 before flowing.)

Microwave radiation may be also utilized to dry or remove unwanted moisture from wafers. Conventional wafer drying techniques rely upon the drying of wafers using centrifugal properties of a dryer together with a heat sink to remove water from the wafers. Wafers may be dried by placing them in a microwave oven with or without the present of microwave absorbing coatings.

Depending upon the particular embodiment, microwave power and heating time, together with the frequency of microwave radiation may be adjusted. The frequency of the microwave radiation may be adjusted or tuned to match resonances in the microwave absorbing material 17. Appropriate tuning and filtering may be accomplished by those of skill in the art. Dopants may be introduced into various semiconductor substrates by introducing appropriate dopant containing gases through pipe 51 into cavity 11 during microwave heating.

The invention claimed is:

1. A method of integrated circuit fabrication comprising:
   causing a reaction in a substrate by heating the substrate; and
   heating the substrate by subjecting a microwave absorbing substance on the substrate to microwave radiation without generation of plasma, said substrate having partially fabricated circuits thereon, the microwave absorbing substance having a resonance frequency, said microwave radiation being adapted to the resonance frequency to cause the microwave absorbing substance to heat.

2. The method of claim 1 in which said microwave absorbing substance is chosen from the group consisting of carbon and silicon nitride.

3. The method of claim 1 in which the underside of said substrate is coated with said microwave absorbing substances.

4. The method of claim 1 in which said substrate has first regions of a first conductivity type and second regions of a second conductivity type and said microwave absorbing substance overlies said first regions.

5. The method of claim 1 in which said substrate is covered by a dielectric and said microwave heating causes said dielectric to flow.

6. The method according to claim 1 wherein the microwave absorbing substance is a coating formed on the substrate.

7. The method of claim 1 wherein the reaction is one of activating a dopant in the substrate and drying the substrate.

8. A method of integrated circuit fabrication comprising:
   heating a substrate by subjecting a microwave absorbing substance on the substrate to microwave radiation without generation of plasma in which exposure to said microwave radiation causes removal of moisture from said substrate, said substrate having partially fabricated circuits thereon the microwave absorbing substance having a resonance frequency, said microwave radiation being adapted to the resonance frequency to cause the microwave absorbing substance to heat.

9. A method of integrated circuit fabrication comprising:

heating a substrate by subjecting a microwave absorbing substance on the substrate to microwave radiation without generation of plasma, said substrate having partially fabricated circuits thereon, the microwave absorbing substance having a resonance frequency, said microwave radiation being adapted to the resonance frequency to cause the microwave absorbing substance to heat, said substrate exposed to a dopant gas during said exposure to microwave radiation.

10. A method of integrated circuit fabrication comprising:

forming a patterned microwave absorbing material on a substrate, the substrate having partially fabricated integrated circuits thereon;

causing a reaction in the substrate by heating a portion of the substrate adjacent to the microwave absorbing material; and selectively heating the portion of the substrate adjacent to the microwave absorbing material by subjecting the patterned microwave absorbing material to microwave radiation.

11. The method according to claim 10 wherein the patterned microwave absorbing is subjected to microwaves without a further material formed on the patterned microwave absorbing material.

12. The method according to claim 10 wherein the patterned microwave absorbing is subjected to microwaves prior to forming a further material on the patterned microwave absorbing material.

13. The method according to claim 10 wherein the patterned microwave absorbing material is a coating formed on the substrate.

14. A method of integrated circuit fabrication comprising:

forming an absorbing material adapted for absorbing microwaves on a substrate, the substrate having partially fabricated integrated circuits thereon and the absorbing material having a resonance frequency;

causing a reaction in the substrate by heating the substrate; and heating the substrate by subjecting the microwave absorbing material to microwave radiation adapted to the resonance frequency.

15. The method according to claim 14 wherein the absorbing material is subjected to microwaves without a further material formed on the absorbing material.

16. The method according to claim 14 wherein the absorbing material is a coating formed on the substrate.

17. The method according to claim 14 further comprising providing a microwave source adapted for producing microwaves adjusted to the resonance frequency of the microwave absorbing material.

18. The method of claim 14 wherein the reaction is one of activating a dopant in the substrate and drying the substrate.

19. A method of integrated circuit manufacture comprising:

forming a first layer on a substrate;

causing a reaction in the first layer by heating the substrate; and heating the substrate by subjecting a microwave absorbing substance on the substrate to microwave radiation.

\* \* \* \* \*